United States Patent [19]
Tran

[11] Patent Number: 5,621,695
[45] Date of Patent: Apr. 15, 1997

[54] SRAM WITH SIMPLIFIED ARCHITECTURE FOR USE WITH PIPELINED DATA

[75] Inventor: Thinh D. Tran, Milpitas, Calif.

[73] Assignee: Galvantech, Inc., Milpitas, Calif.

[21] Appl. No.: 502,974

[22] Filed: Jul. 17, 1995

[51] Int. Cl.$^6$ .................................................. G11C 8/00
[52] U.S. Cl. .................. 365/230.03; 365/189.05; 365/221; 365/230.09; 365/233
[58] Field of Search ................ 365/189.05, 221, 365/230.09, 230.03, 233

[56] References Cited

U.S. PATENT DOCUMENTS 5,293,623  3/1994  Froniewski et al. ............... 365/221

Primary Examiner—Amir Zarabian
Assistant Examiner—F. Niranjan
Attorney, Agent, or Firm—Graham & James LLP

[57] ABSTRACT

A high speed high capacity SRAM having a density of 256K bits or larger. Individual complementary memory cell pairs are arranged in memory blocks and are directly accessed during write and read operations by input/output circuitry having an input buffer, write driver circuits, sense amplifiers, an output buffer and an output register. Data is read from individual memory blocks using a pipelined read data mode in which data accessed by a row, column and block address during a first cycle is stored in an output (pipeline) register at the beginning of the next cycle. In one embodiment all components of the data input/output circuits are located remotely from the memory blocks and paired data lines are used. In an alternate embodiment, the input buffer, a pipeline register and output buffer components of the data input/output circuits are remotely located, and these components are coupled via single data lines and multiplexers to local write drive and sense amplifier circuits located closely adjacent the individual memory blocks. The SRAM is capable of comparable performance to a divided word line SRAM using modular architecture, but has a much simpler design requiring less area.

2 Claims, 14 Drawing Sheets

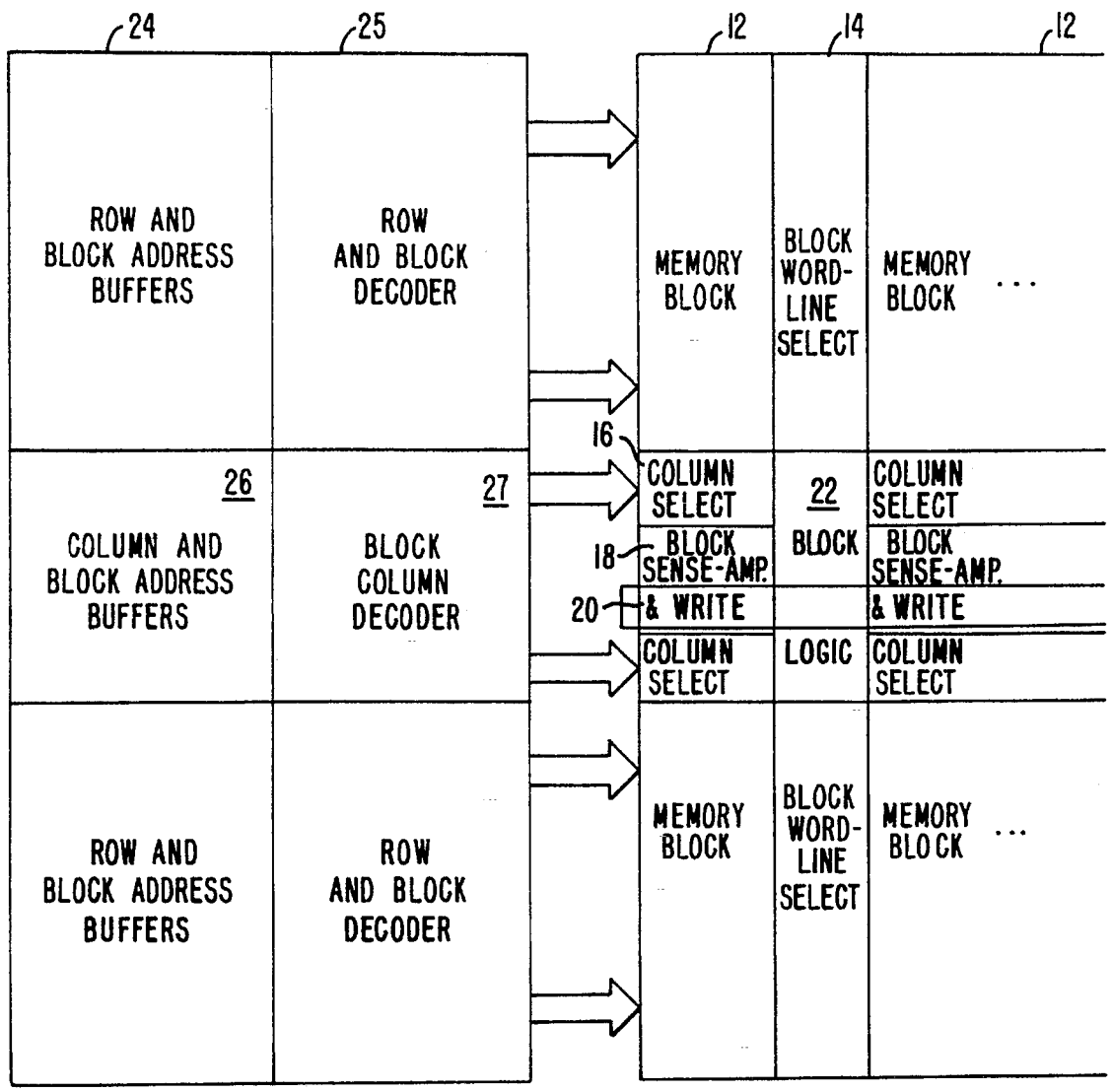
FIG. 1A. PRIOR ART
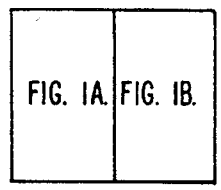

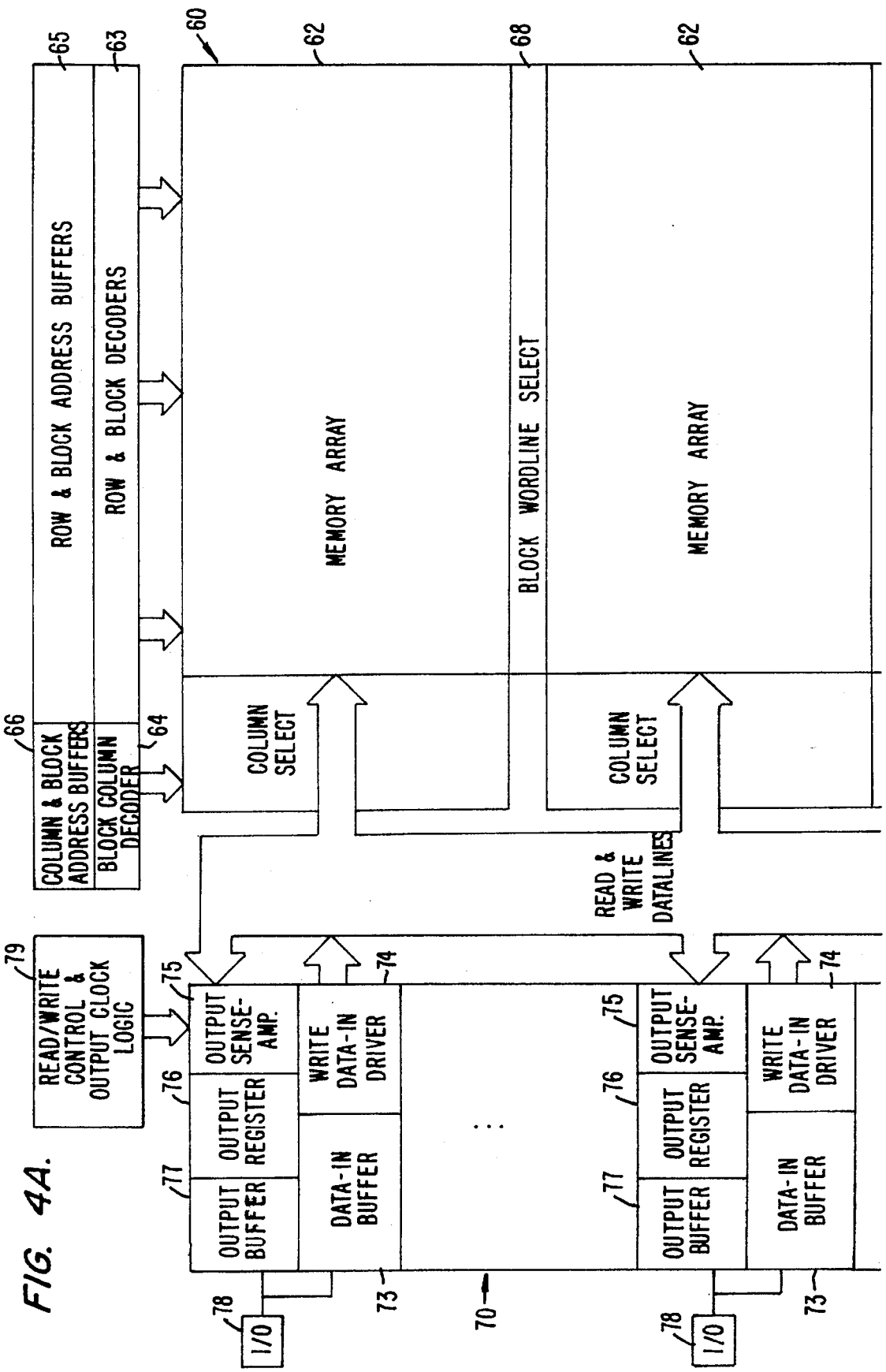

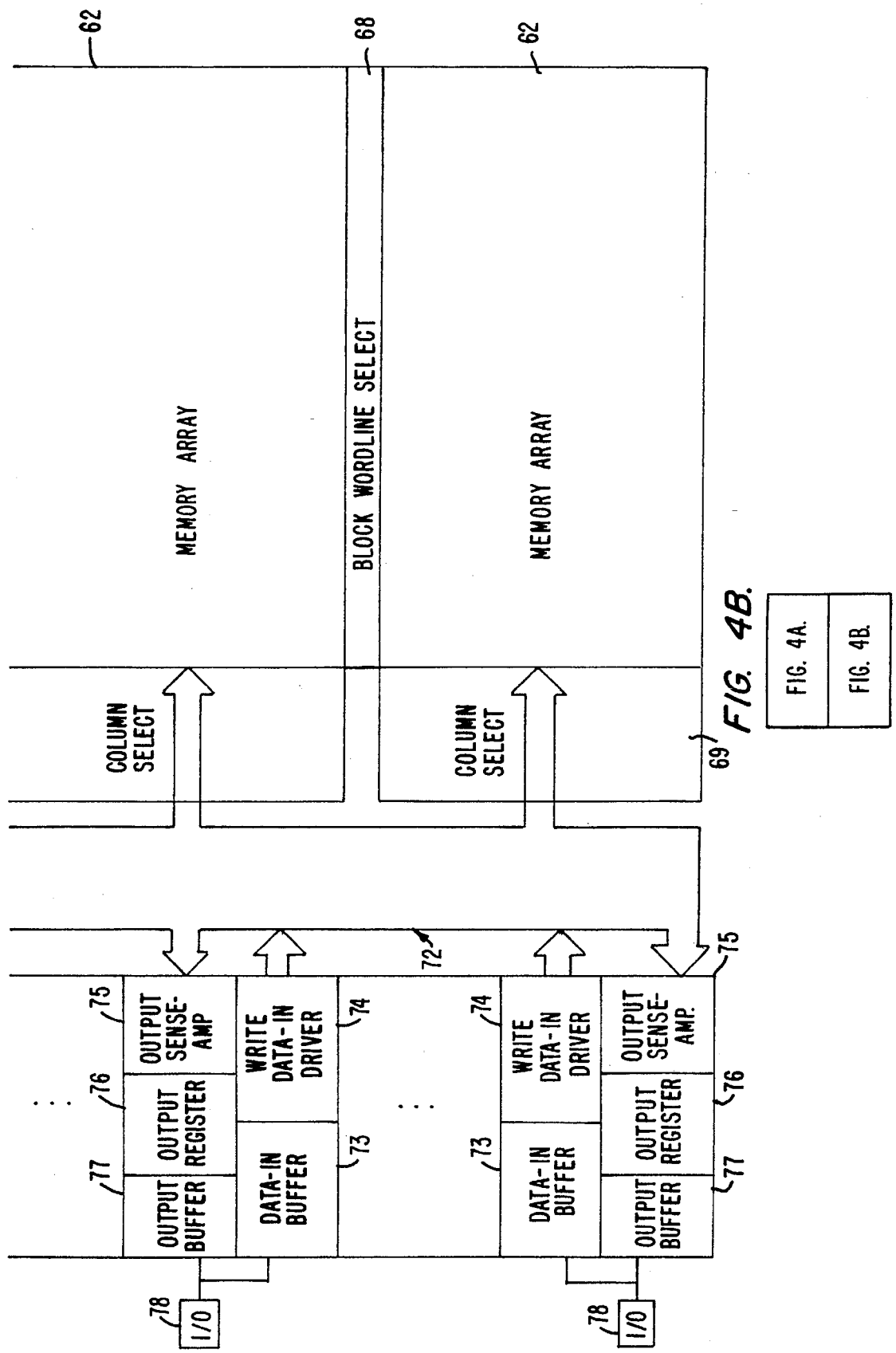

SRAM WITH SIMPLIFIED ARCHITECTURE FOR USE WITH PIPELINED DATA

BACKGROUND OF THE INVENTION

This invention relates to static random access memory devices, commonly termed SRAMs. SRAMs are currently used in a wide variety of applications requiring relatively fast memory, such as cache memory applications. A typical smaller capacity SRAM (64K bit density or less) includes a plurality of individual memory cells, typically implemented as four insulated gate transistors and load resistors and associated logic for providing row and column addressing, data input buffering and write drivers, output sense amplifiers and output buffers. Each individual memory cell is accessed directly by row and column decoding to activate the word lines and to select the bit lines in the array, and write and read operations are performed using the data input buffer and write driver circuitry (for a write operation) and the sense amplifier and output buffer circuitry (for a read operation). This approach can be defined as the streamlined approach to SRAM organization and operation.

As processor speeds increase, along with the demand for SRAMs of ever increasing memory capacity with access times compatible with the faster processors, the physical limit of the original SRAM design using the streamlined approach is reached. As a consequence, the SRAM architecture has been modified by what is commonly termed the modular approach employing a local block sense amplifier along with an output sense amplifier. In the modular architecture, typically found in SRAMs having a density of 256K bit or larger, the memory cells are arranged in smaller blocks than the full matrix size, and each block is provided with a complete set of associated logic. With reference to FIG. 1, which is a diagram of an SRAM using this modular approach, each memory block 12 has associated block word line select logic 14, column select logic 16, block sense amplifiers 18, block write drivers 20 and other block logic 22. The individual blocks and the individual memory cells within each block are addressed by means of row and block address buffers 24, row and block decoders 25, column and block address buffers 26, and column and block decoders 27 which receive row, column and block address information via an address bus (not shown). Each individual block word line 14 is coupled to main data lines 30 which provide interconnection between the individual memory blocks 12 and the input/output data circuitry generally designated with reference numeral 35 and which includes a plurality of data input buffers 36, write data drivers 38, output sense amplifiers 40 and data output buffers 42. FIG. 2 is a more detailed view of the control circuitry for a single memory block 12. As seen in this figure, each memory block 12 includes a plurality of bit lines 50 and complementary bit lines 51, and a plurality of word lines 52, to which selected ones of individual memory cells 55 are coupled. The column select and block word line select circuitry 16, 14 are located within the memory block 12, as are the individual block write circuit 20, block sense amplifiers 18 and block logic 22. Access to individual memory cells 55 in a given memory block 12 requires both the local read/write circuitry 18, 20 and 22 termed the secondary read/write circuitry, as well as the relatively remote (but still on the chip) primary read/write circuitry 36, 38, 40 and 42. Thus, even though the modular architecture provides relatively fast access compatible with high speed processors (access times of 20 nanoseconds or less) with relatively large storage capacity (256K bits or greater), this relatively fast access and large storage capacity is achieved only at the penalty of requiring a relatively large number of active secondary read/write circuits closely adjacent the individual memory cells of a given memory block in addition to the primary chip read/write circuits in the input/output data circuitry. As a consequence, the size of an SRAM using the modular architecture is substantially larger than normally desirable, and the inclusion of a relatively large number of secondary read/write circuits and control logic tends to decrease the yield of usable SRAM integrated circuits from a given wafer and thus increases the per unit die cost.

SUMMARY OF THE INVENTION

The invention comprises a high density SRAM (256K bit or higher) with read access speed and memory capacity comparable to that of the modular line architecture SRAM, but substantially simpler in design and devoid of any secondary read/write and control circuitry. The invention provides this high speed access only when used with a pipelined read data operation. The invention takes advantage of the characteristic of the pipelined read data mode of operation that the output data corresponding to a given input address need not be presented to the external data bus during the same cycle that the input address is presented to the SRAM address input buffers, but is actually manifested on the external data bus sometime during the next succeeding cycle. So long as the SRAM architecture is capable of presenting the data specified by the current address to the output register (termed the pipeline register) prior to the end of the clock cycle, the data can be reliably accessed and presented to the external data bus during the next cycle. The architecture employed in the invention is the direct read form of architecture which does not require secondary write drivers, sense amplifiers and local block logic circuitry for operating these elements. Consequently, for a given high density memory capacity (e.g. 256K bits or higher), SRAMs constructed according to the invention are smaller in size and involve less complex circuitry than the modular architecture SRAMs.

From an apparatus standpoint, the invention comprises a high speed, high density (256K bits or higher) SRAM having row, column and block address circuitry for receiving pipelined row, column and block address information during a pipelined read operation; a plurality of memory arrays each having a plurality of memory cells and a plurality of word lines and bit lines coupled to individual ones of the memory cells; a plurality of block word line select logic circuits each associated to a different one of the plurality of arrays of memory cells and coupled to the row and block address circuitry for selecting individual ones of the word lines in response to receipt of row and block address information; a plurality of column select logic circuits each associated to a different one of the plurality of arrays of memory cells and coupled to the column and block address circuitry for selecting individual ones of the bit lines in response to receipt of column and block address information; data input/output circuitry for manifesting in pipelined form data read from individual memory cells specified by the row, column and block address information; and a plurality of data lines coupled between the input/output circuitry and the plurality of memory arrays. The SRAM is devoid of secondary sense amplifiers and write drivers whereby data is read directly from the plurality of memory arrays in pipelined mode.

In a first embodiment, the input/output circuitry includes a plurality of read/write interface circuits. Each read/write interface circuit includes a data input buffer and a data output buffer coupled directly to the associated input/output terminal. Each read/write interface circuit also includes an data input write driver coupled to the data input buffer and coupled via the data lines directly to selected ones of the memory cells in the memory arrays during a write operation, a sense amplifier coupled via the data lines directly to selected ones of the memory cells in the associated memory array during a read operation, and an output register coupled to the sense amplifier and coupled directly to the data output buffer.

In an alternate embodiment of the invention, the input/output circuitry includes a plurality of data input/output buffering circuits each associated to a different input/output terminal. Each buffering circuit includes a data input buffer, a data output buffer and a data output register. The SRAM further includes a plurality of local read/write circuits each associated to a different one of the memory arrays and each coupled to the data input/output buffering circuits via the plurality of data lines. Each local read/write circuit includes a multiplexer coupled to the data lines, a plurality of input data write drivers coupled to the data input buffers via the multiplexer and the data lines and coupled directly to selected ones of the memory cells in the associated memory array during a write operation, and a plurality of sense amplifiers coupled to the data output registers via the multiplexer and the data lines and coupled directly to selected ones of the memory cells in the associated memory array during a read operation.

The invention provides a simplified architecture for a high density (256K bits or higher) SRAM by eliminating the need for any secondary write circuits and secondary sense amplifiers, while still providing high speed access to data stored in memory blocks for reading the data in a pipelined data read mode of operation.

For a fuller understanding of the nature and advantages of the invention, reference should be had to the ensuing detailed description, taken in conjunction with the accompanying drawings.

BRIEF DESCRIPTION OF THE DRAWINGS

FIG. 4 is a block diagram of a first embodiment of the invention;

DETAILED DESCRIPTION OF THE PREFERRED EMBODIMENTS

Figure 1B:
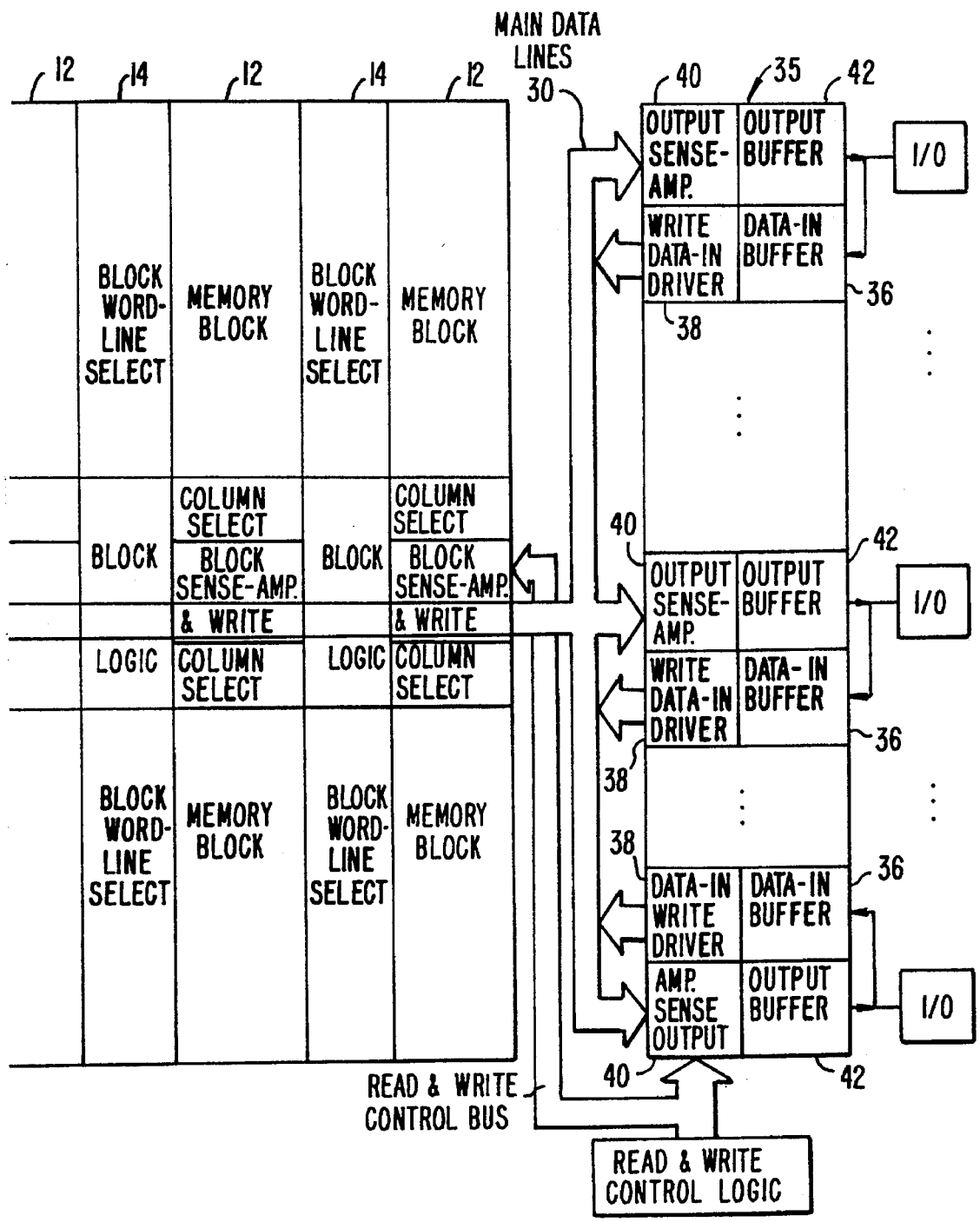
FIG. 1 is an architectural diagram of a divided word line architecture SRAM.
Figure 2A:
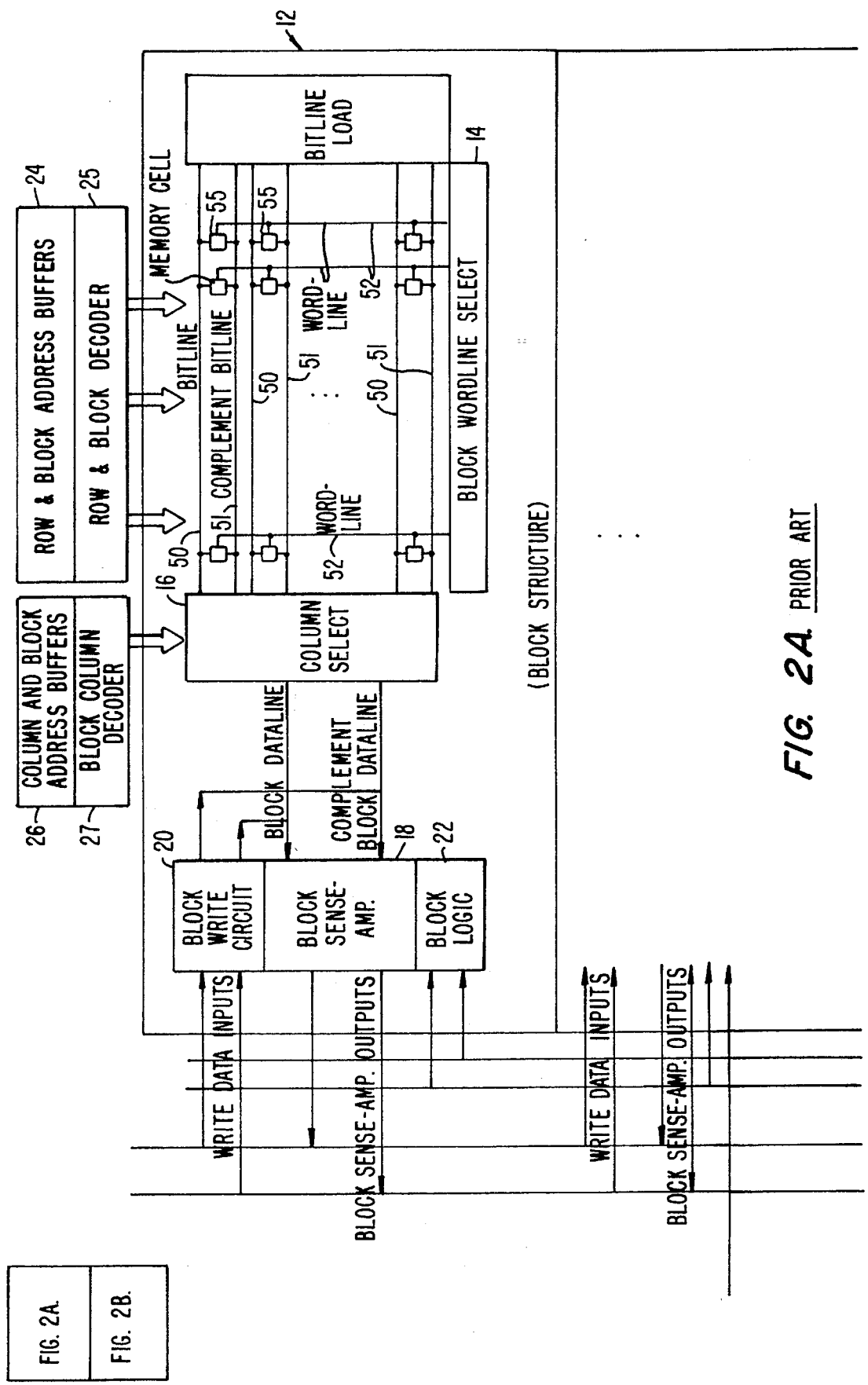
FIG. 2 is a more detailed diagram of the FIG. 1 system illustrating the local read/write control circuitry for a single memory block.
Figure 2B:
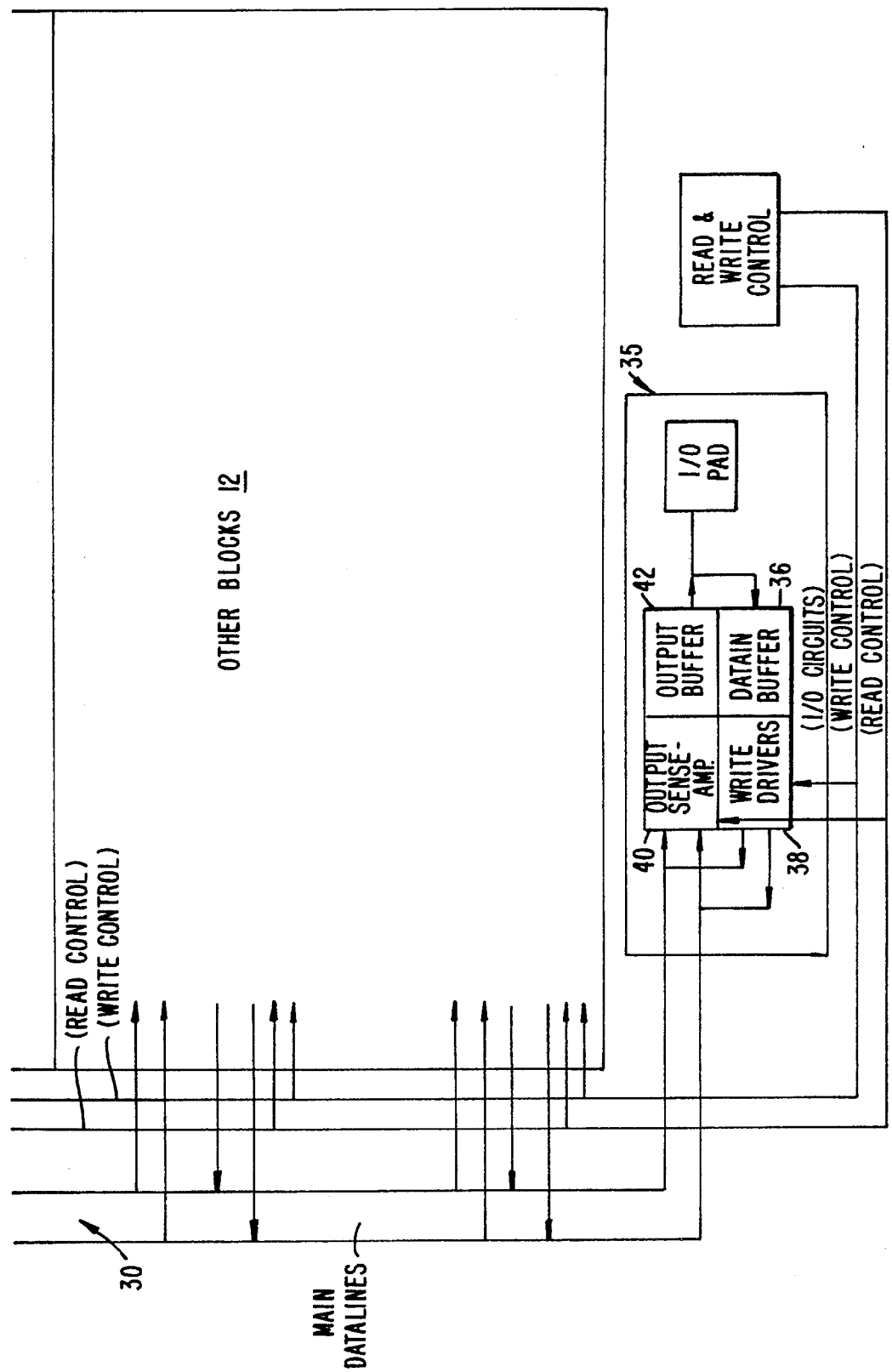
Figure 3A:
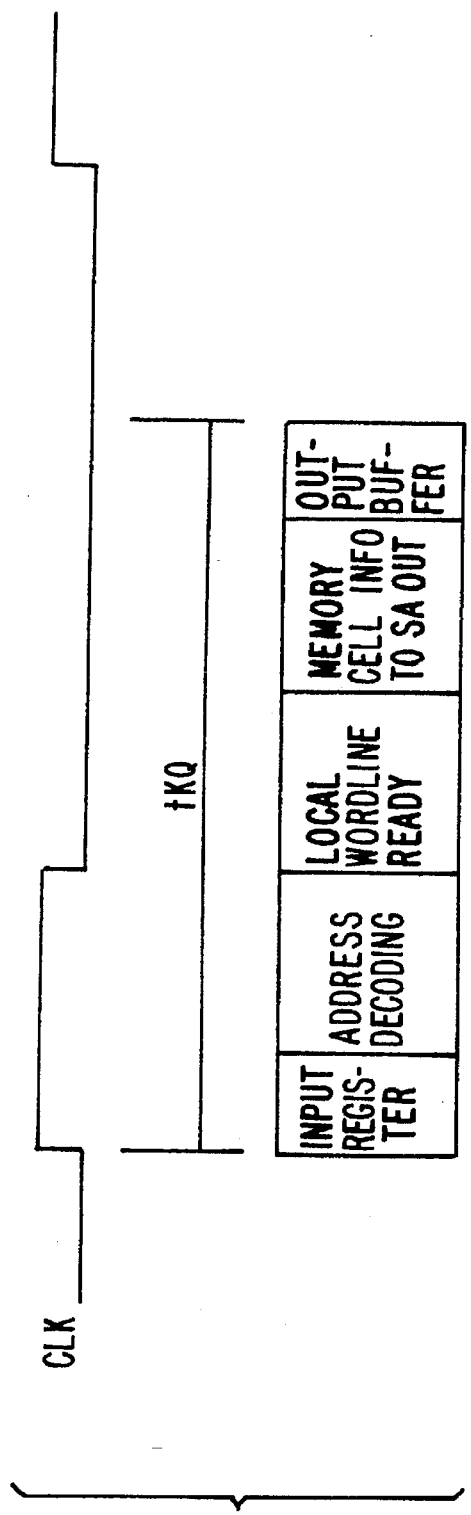
FIGS. 3A and 3B are illustrative timing diagrams comparing the flow- through read data mode versus pipeline read data mode.
Figure 3B:
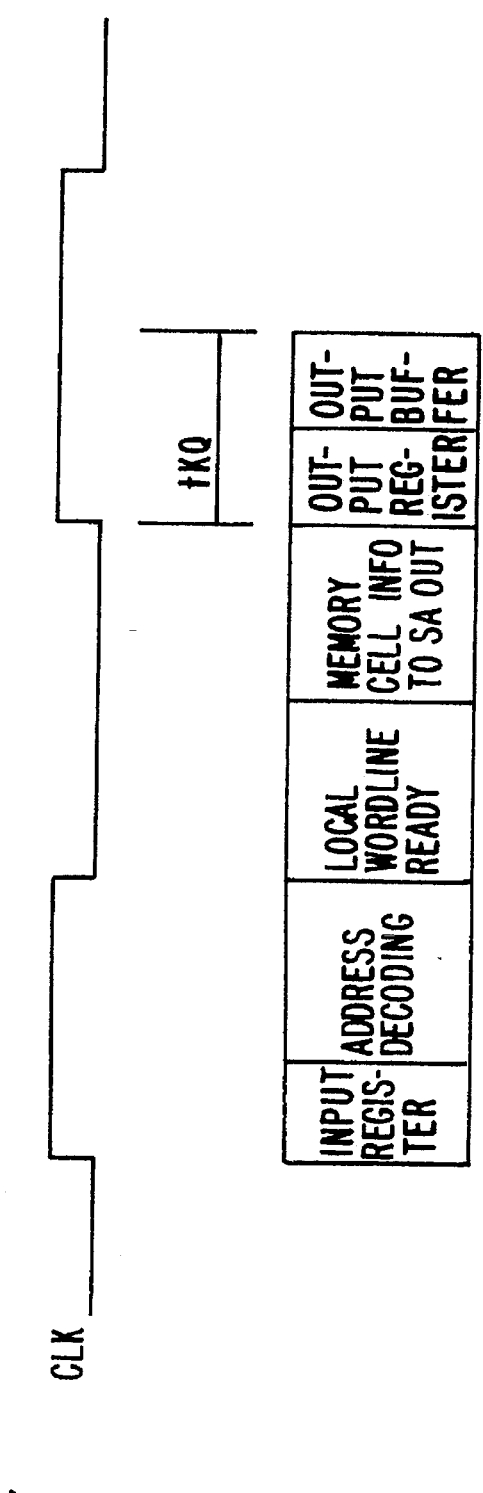

Turning now to the drawings, FIGS. 3A and 3B illustrate the operational differences between the operation of a memory device in flow-through read data mode (FIG. 3A) and pipeline read data mode (FIG. 3B). With reference to FIG. 3A, CLK designates the clock signal and tKQ represents the minimum time period within a clock cycle required to present data to an output buffer in response to the receipt of a row, column and block address in an input register during a flow-through read data operation. At the beginning of a cycle, the row, column and block address is stored in an input register, after which the address is decoded. Once the memory cells in a given memory block have been selected in response to the row, column and block addresses, the information stored in the individual memory cells is presented to the sense amplifiers coupled to the selected bit lines. The data sensed by the individual sense amplifiers is then sent to an output buffer. Once the data is sent to the output buffer, it is presented to the external data bus, which completes one cycle of a read operation. The next cycle commences with the presentation of another row, column and block address, followed by the address decoding and remaining steps described above.

With reference to FIG. 3B, in the pipelined read data mode of operation, presentation of the data to the external data bus is done during a different, later cycle than the cycle during which the corresponding row, column and block address is stored in the input register. More particularly, at the beginning of a given clock cycle, an address is stored in the input register, after which the address is decoded. Once the word line has been selected, the memory cell information is presented to the individual bit line sense amplifiers. At the beginning of the next cycle, the data present at the output of the individual sense amplifiers is stored in the output register (frequently termed the pipeline register) and then transferred to the output buffer. Also at the beginning of the subsequent cycle, a new row, column and block address is stored in the input register for address decoding and the following steps already described. As can be seen from a comparison of the two modes of operation, during the flow-through mode the SRAM must wait until the data has been read from the output buffer before the next row and column address can be accepted. Stated differently, the period of the shortest permissible clock cycle is dependent upon the minimum acceptable processing time for the five steps involved. In contrast, in the pipelined mode of operation, the SRAM is ready to accept the next succeeding row, column and block address when the sense amplifier outputs are stored into the output register, which is usually termed the pipeline register. Stated differently, the minimum clock period is only limited by the four steps of loading a new address into the input register, decoding the address, waiting until the word line has been selected and outputting the information in the selected memory cells to the sense amplifiers. As a consequence, given a clock period of predetermined length, an SRAM with a slower access time can still reliably retrieve data when operated in a pipeline mode. It is this principle of operation which enables the invention to be used with the current fast processors.

Figure 5A:
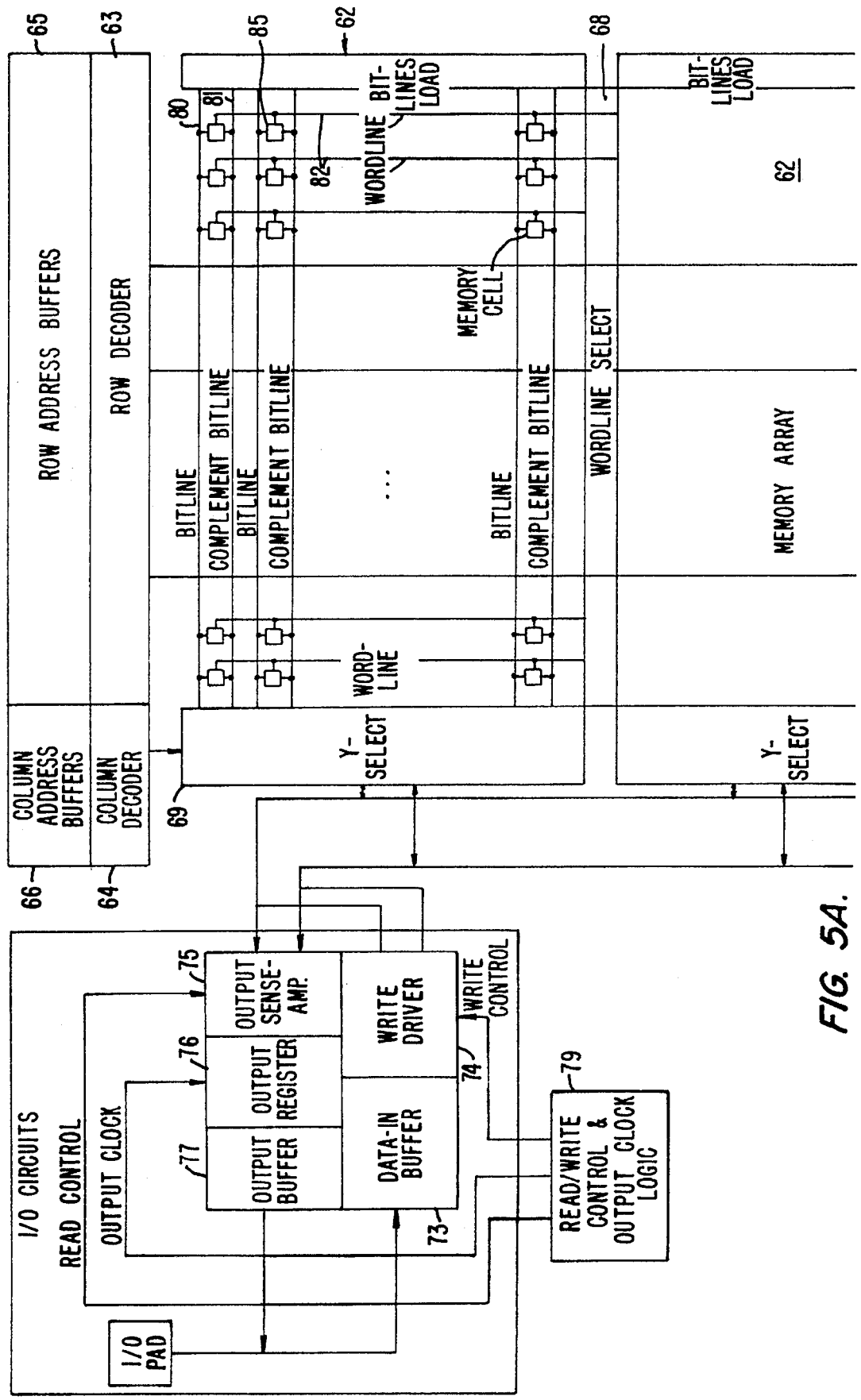
FIG. 5 is a more detailed diagram of the system of FIG. 5 showing the direct access data flow.
Figure 5B:
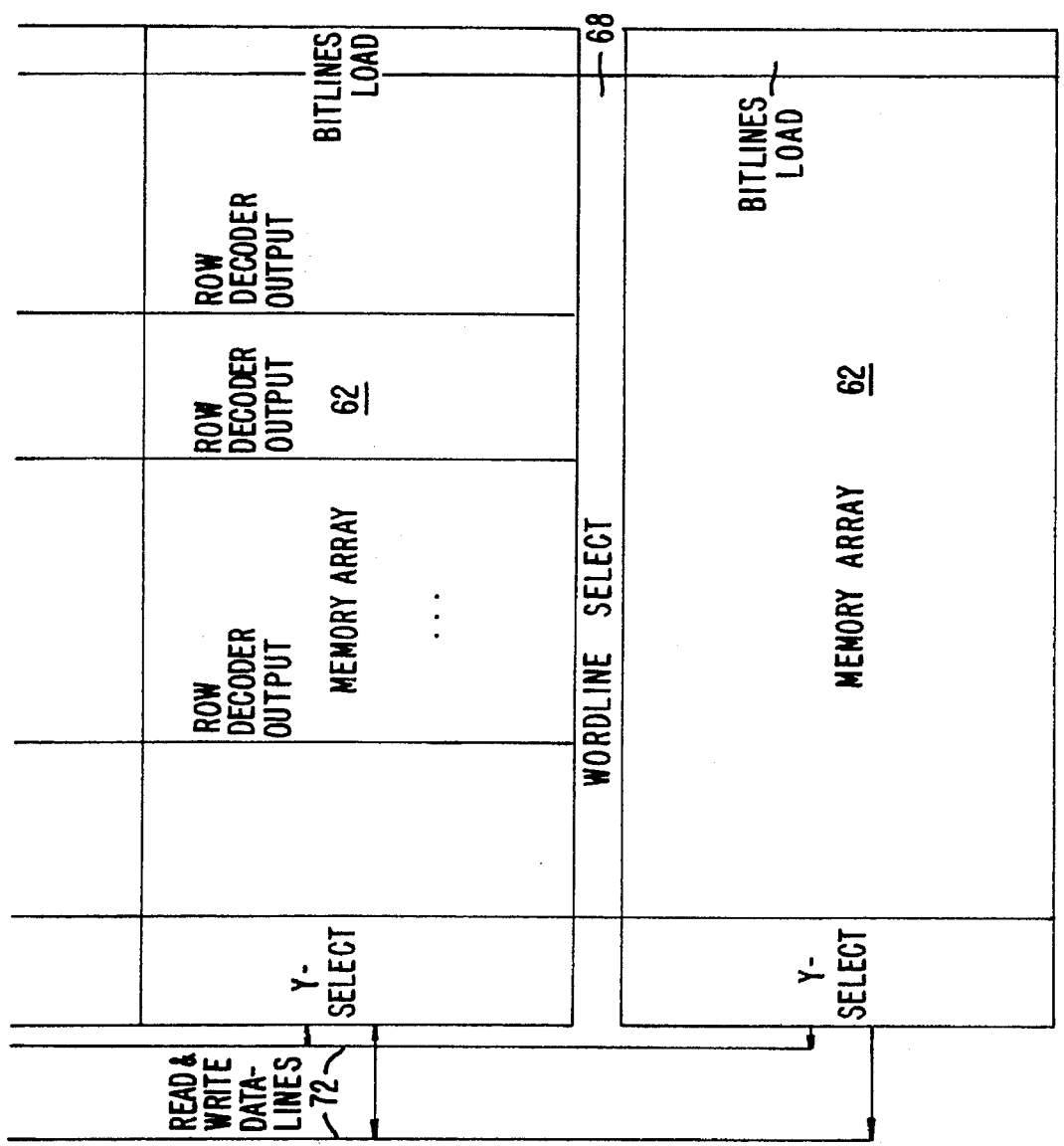

FIGS. 4 and 5 illustrate a first embodiment of the invention in which the data input/output circuitry is contained in a single region separated from the individual memory arrays and connected thereto by means of a plurality of read and write data line pairs. With reference to FIG. 4, a high density (256K bit or higher) SRAM 60 includes a plurality of memory arrays 62 arranged in blocks for addressing by a row and block decoder 63 and a column and block decoder 64. Row and block decoder 63 decodes the row and block portion of the address stored in a row and block address buffer 65 while column and block decoder 64 decodes a column and block portion of the address stored in column and block address buffer 66. As with conventional SRAMs, the row and column addresses are supplied on an external address bus (not illustrated). The block portion of each row and column address is likewise supplied on the external address bus. Each memory block 62 is provided with block word line select logic 68 and column select logic 69. Block word line select logic 68 is responsive to the row and block decode signal supplied by row and block decoder 63 to select a given word line in a particular block 62. Column select logic 69 selects the individual bit line pairs in response to the column and block address supplied thereto. Input/output data circuitry generally designated with reference numeral 70 is directly coupled to each memory block 62 by means of a plurality of read and write data lines 72. Input/output data circuitry 70 includes a plurality of groups of read/write circuits, each such group being associated to a different data input/output pad 78.

Each group of read/write circuits includes a data input buffer 73 for receiving externally supplied data, a write data input driver 74 which is used to write data into the appropriate memory cell pairs in a selected memory array 62 (selected in response to addresses supplied to the row, column and block address buffers 65, 66), an output sense amplifier bank 75 for sensing data from an accessed memory cell in a given memory block 62 (in response to row, column and block addresses), an output register 76 for temporarily storing read data, and an output buffer 77 for providing the read data to the input/output pad 78 connected to the external data bus.

A read/write control and output clock logic circuit 79 responds to the externally supplied read and write control signals to condition the input/output data circuitry 70, the address decoders and buffers 63–66 and the block word line select 68, column select 69 and bit line precharge (not illustrated) circuitry in response to the receipt of externally supplied address and control signals.

FIG. 5 is a more detailed view of the control and address circuitry for a single memory block 62. As seen in this figure, each memory block 62 includes a plurality of bit lines 80 and complementary bit lines 81, and a plurality of word lines 82, to which selected ones of individual memory cells 85 are coupled. The column and block word line select circuitry 69, 68 are located within the memory block 62: however, there are no individual block write circuits, block sense amplifiers and block logic circuits: in contrast to the prior art modular approach architecture, in the embodiment of the invention shown in FIGS. 4 and 5 read and write operations involving individual memory cells 85 in a given memory block 62 only require the associated group of read/write circuits 73–77 located in the input/output data circuitry 70. Consequently, the SRAM 60 of FIGS. 4 and 5 is operated in direct access mode on a block by block basis using the streamlined approach.

Figure 6:
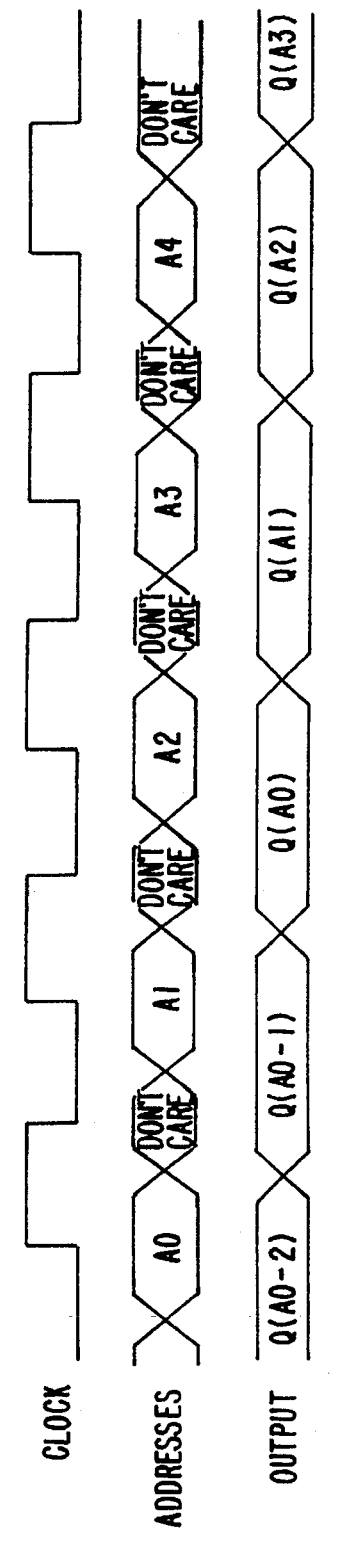
FIG. 6 is a timing diagram illustrating a read operation for pipelined data.

FIG. 6 illustrates the pipelined read data mode of operation for the SRAM embodiment 60 of FIGS. 4 and 5. This figure illustrates the relative timing between the system clock applied to the SRAM 60, the occurrence of successive addresses and the appearance of the output data Q. As seen in this figure, address A0 is applied to row, column and block address buffers 65, 66 during some portion of an initial clock cycle. At the corresponding portion of the next clock cycle, the next successive address A1 is presented to the row, column and block address buffers 65, 66 and the data Q(A0) corresponding to address A0 is manifested in the output buffer 77 corresponding to the memory block 62 selected by address A0. In the next succeeding clock cycle, address A2 is presented to the row, column and block address buffers 65, 66, and the data Q(A1) corresponding to address A1 is manifested by the output buffer 77 corresponding to the memory block 62 addressed by previous address A1. This pipelined sequence continues throughout the read operation.

Figure 7A:
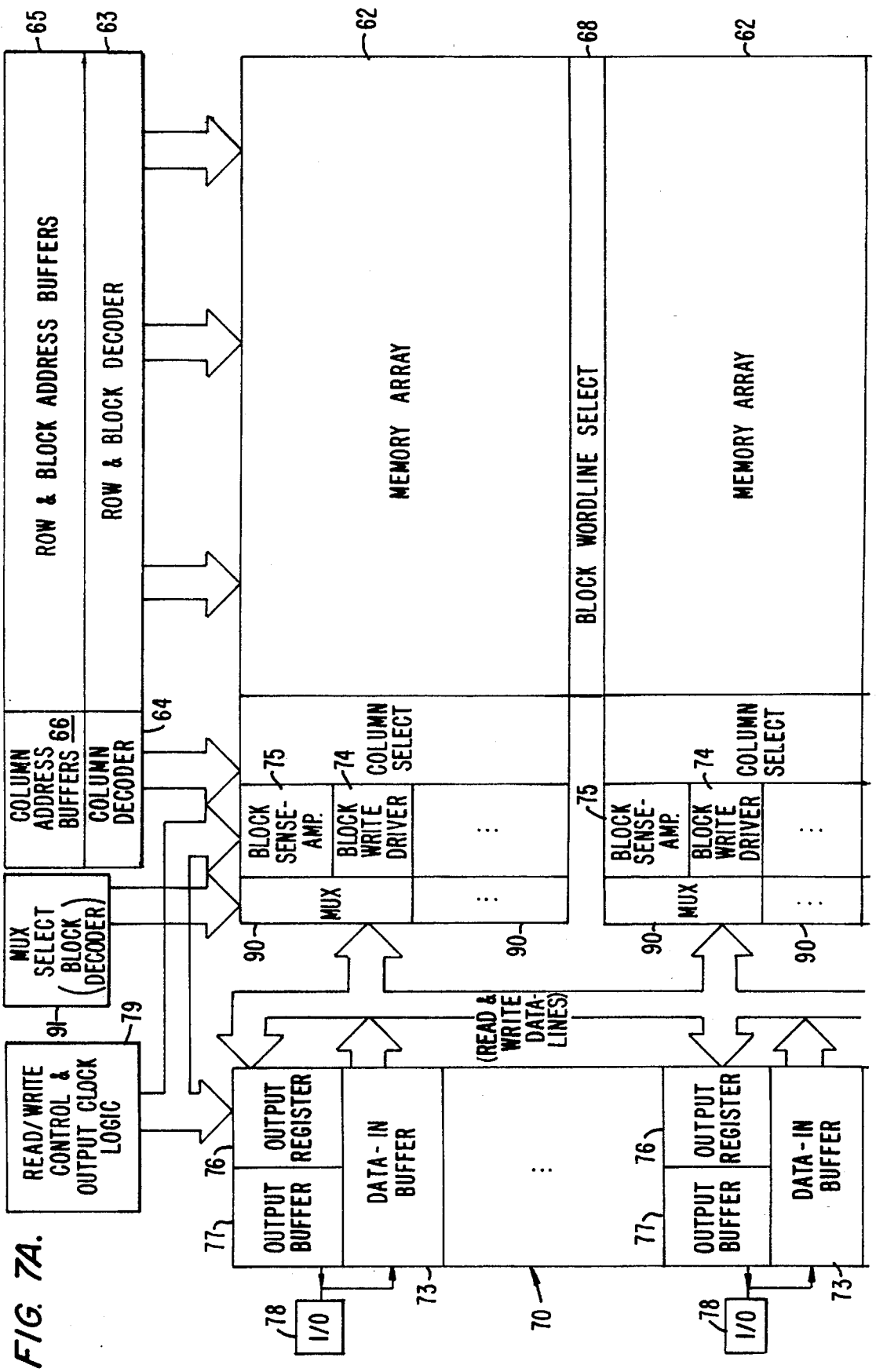
FIG. 7 is a block diagram of an alternate embodiment of the invention.
Figure 7B:
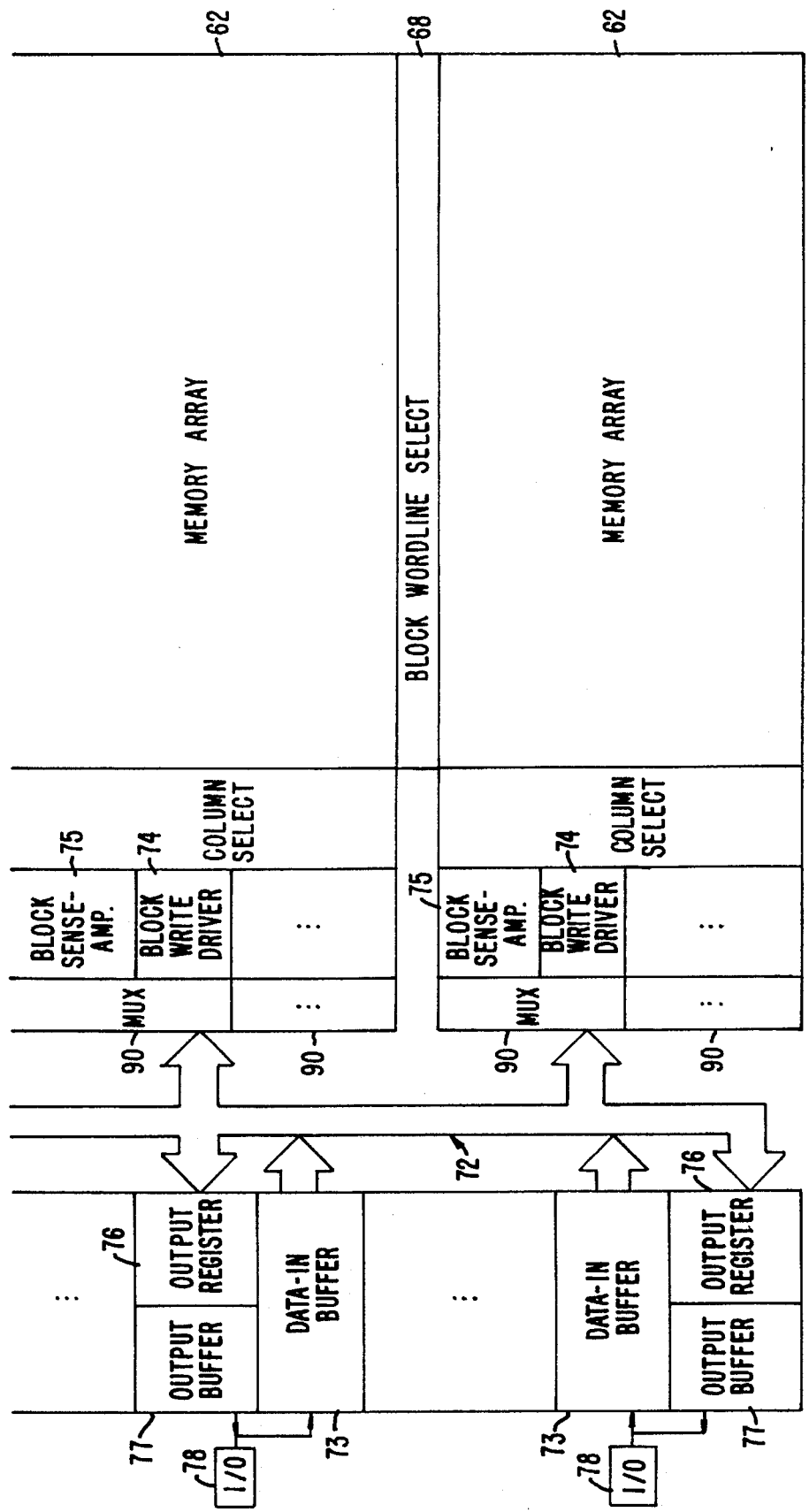
Figure 8A:
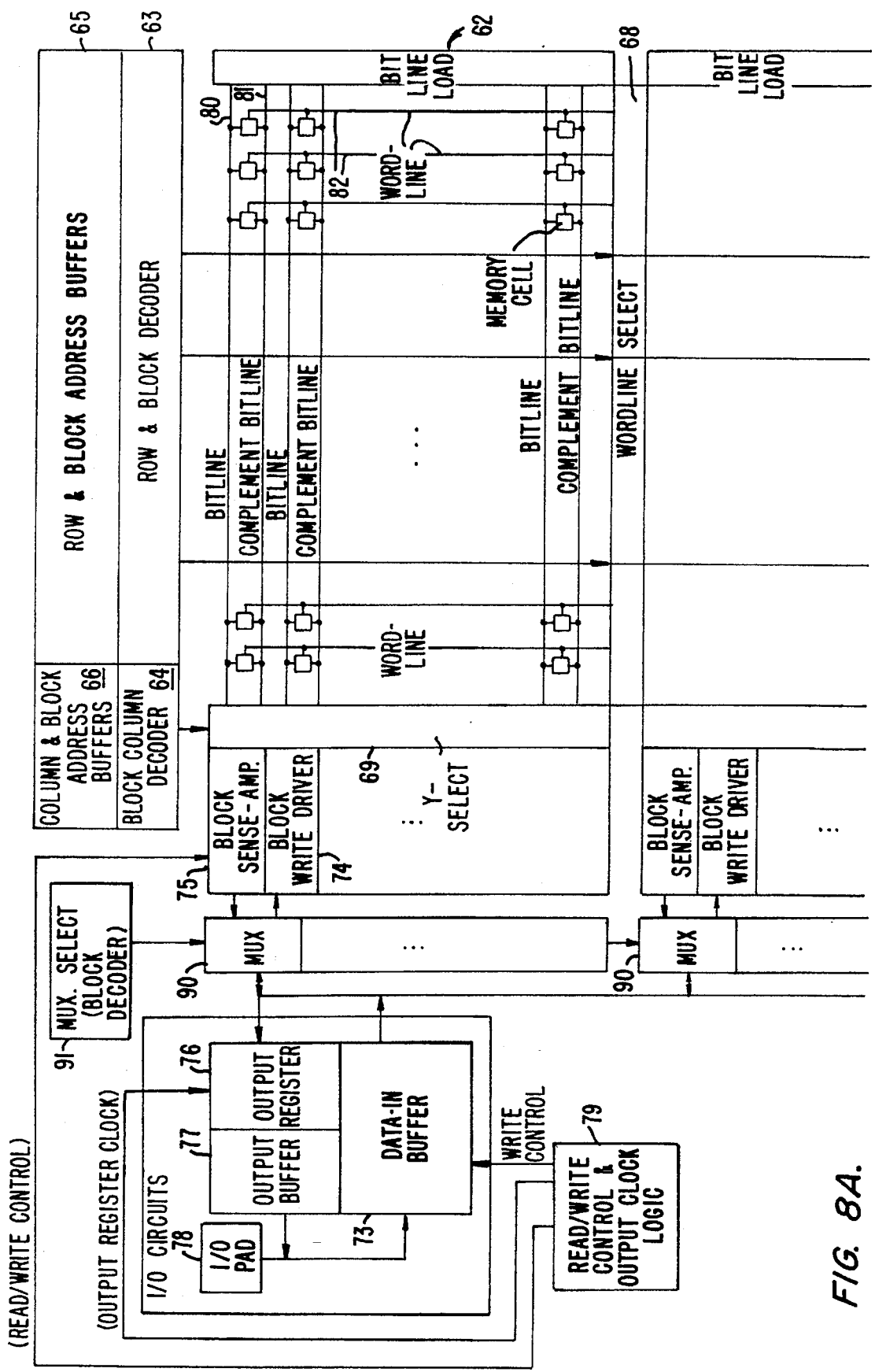
FIG. 8 is a more detailed view of the FIG. 7 embodiment illustrating the direct access data flow.
Figure 8B:
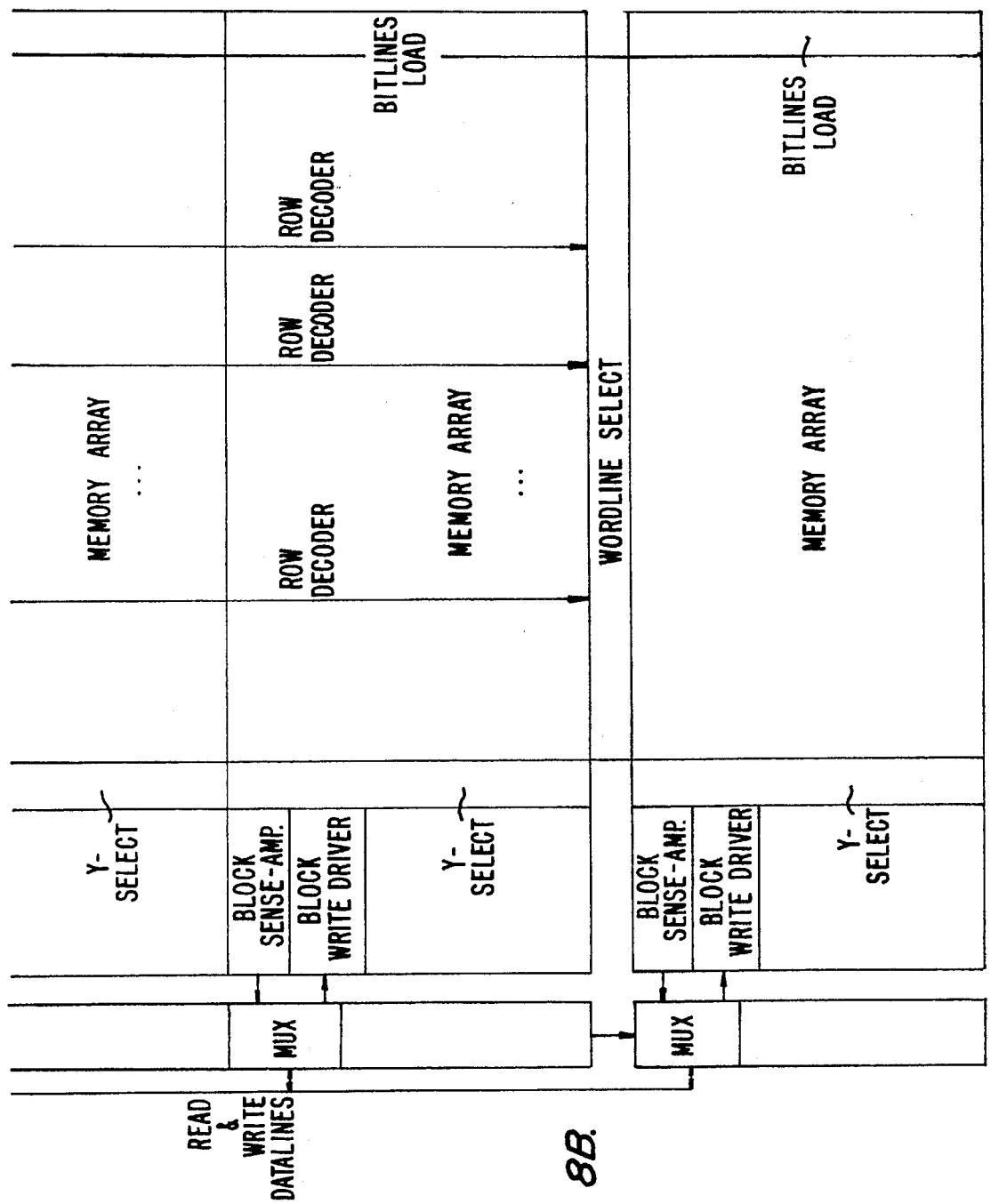

FIGS. 7 and 8 illustrate a second embodiment of the invention which employs the same principle as the embodiment of FIGS. 4 and 5 but which provides a different arrangement for the input/output data circuitry 70 which requires only one-half the number of data lines used by the embodiment of FIGS. 4 and 5. As seen in this figure, input/output data circuitry 70 includes the data input buffers 73, data output registers 76, data output buffers 77 and input/output terminals 78. The block write data input drivers 74 and output sense amplifiers 75 are located closely adjacent each memory block 62. In addition, a multiplexer 90 is added for each memory block 62 and is selectively controlled by the block address decoding via a multiplexer select circuit 91 to couple the individual block write drivers 74 via data lines 72 to the corresponding data input buffers 73; and to couple the block sense amplifiers 75 to the corresponding output registers 76 via data lines 72. Operation of the embodiment of FIGS. 7 and 8 during pipelined read mode is essentially identical to that described above with reference to the embodiment of FIGS. 4 and 5. The embodiment of FIGS. 7 and 8 requires that each memory block 62 include a number of block write drivers 74 and block sense amplifiers 75 equal to the number of data input/output terminals 78. However, this increased number of active read/write devices is still substantially smaller than the number of comparable devices required in an SRAM using the modular approach. The embodiment of FIGS. 7 and 8 offers the advantage of requiring only one-half the number of data lines 72 required by the embodiment of FIGS. 4 and 5 (since the inputs of the block write drivers 74 and the outputs of the block sense amplifiers 75 require only a single conductive path).

As will now be apparent, the invention provides a simplified architecture for a high density SRAM by eliminating the need for any secondary block write circuits and block sense amplifiers, while still providing high speed access to data stored in memory blocks for reading the data in a pipelined data read mode of operation. Because of the elimination of the secondary circuits formerly deemed required for high speed operation of high density SRAMs, the area occupied by an SRAM fabricated according to the teachings of the invention and having the same memory capacity and read access time as the prior art modular approach architecture SRAMs is substantially smaller. In addition, by eliminating the secondary block write driver and block sense amplifiers, the complexity of the SRAM is reduced and thus the yield can be expected to increase accordingly.

While the above provides a full and complete disclosure of the preferred embodiment of the invention, various modifications, alternate constructions and equivalents may be employed without departing from the true spirit and scope of the invention. Therefore, the above should not be construed as limiting the scope of the invention, which is defined by the appended claims.

What is claimed is:

1. A high speed high density SRAM for providing random access to stored data in a pipelined read data mode of operation, said SRAM comprising:

row, column and block address circuitry for receiving pipelined row, column and block address information during a pipelined read operation;

a plurality of memory arrays each having a plurality of memory cells and a plurality of word lines and bit lines coupled to individual ones of said memory cells, the total capacity of said plurality of memory arrays being at least 256K bits;

a plurality of block word line select logic circuits each associated to a different one of said plurality of arrays of memory cells and coupled to said row and block address circuitry for selecting individual ones of said word lines in response to receipt of row and block address information;

a plurality of column select logic circuits each associated to a different one of said plurality of arrays of memory cells and coupled to said column and block address circuitry for selecting individual ones of said bit lines in response to receipt of column and block address information;

data input/output circuitry for manifesting in pipelined form data read from individual memory cells specified by said row, column and block address information; and a plurality of data lines coupled between said input/output circuitry and said plurality of memory arrays, said SRAM being devoid of secondary sense amplifiers and secondary write drivers whereby data is read directly from said plurality of memory arrays in pipelined mode, said data input/output circuitry including a plurality of read/write interface circuits, each interface circuit including a data input buffer, a data output buffer, a data input write driver coupled to said data input buffer and coupled directly to selected ones of the memory cells in a memory array selected during a write operation, a sense amplifier coupled directly to selected ones of the memory cells during a read operation, and an output register coupled between said sense amplifier and said data output buffer.

2. A high speed high density SRAM for providing random access to stored data in a pipelined read data mode of operation, said SRAM comprising:

row, column and block address circuitry for receiving pipelined row, column and block address information during a pipelined read operation;

a plurality of memory arrays each having a plurality of memory cells and a plurality of word lines and bit lines coupled to individual ones of said memory cells, the total capacity of said plurality of memory arrays being at least 256K bits;

a plurality of block word line select logic circuits each associated to a different one of said plurality of arrays of memory cells and coupled to said row and block address circuitry for selecting individual ones of said word lines in response to receipt of row and block address information;

a plurality of column select logic circuits each associated to a different one of said plurality of arrays of memory cells and coupled to said column and block address circuitry for selecting individual ones of said bit lines in response to receipt of column and block address information;

data input/output circuitry for manifesting in pipelined form data read from individual memory cells specified by said row, column and block address information; and a plurality of data lines coupled between said input/output circuitry and said plurality of memory arrays, said SRAM being devoid of secondary sense amplifiers and secondary write drivers whereby data is read directly from said plurality of memory arrays in pipelined mode, said data input/output circuitry including a plurality of read/write buffering circuits, each buffering circuit including an input data buffer, an output data buffer and an output register;

said SRAM further including a plurality of read/write circuits each associated to a different one of said memory arrays and each coupled to said data input/output circuitry via said plurality of data lines, each said read/write circuit including a multiplexer coupled to said data lines, a plurality of data input write drivers coupled to said data input buffers via said multiplexer and said data lines and coupled directly to selected ones of the memory cells in the associated memory array during a write operation, and a plurality of sense amplifiers coupled to said data output buffers via said multiplexer and said data lines and coupled directly to selected ones of the memory cells in the associated memory array during a read operation.

\* \* \* \* \*